United States Patent [19]

Brown

[11] 3,877,997

[45] Apr. 15, 1975

[54] SELECTIVE IRRADIATION FOR FAST SWITCHING THYRISTOR WITH LOW FORWARD VOLTAGE DROP

[75] Inventor: Jerry L. Brown, Greensburg, Pa.

[73] Assignee: Westinghouse Electric Corporation, Pittsburgh, Pa.

[22] Filed: Mar. 20, 1973

[21] Appl. No.: 343,070

[52] U.S. Cl. .................... 148/1.5; 357/38; 357/91

[51] Int. Cl. .................... H01l 7/54

[58] Field of Search .......... 148/1.5 CP; 317/235 AB, 317/234

[56] References Cited

UNITED STATES PATENTS

| | | | |
|---|---|---|---|
| 2,911,533 | 11/1959 | Damask | 148/1.5 X |
| 3,272,661 | 9/1966 | Tomono et al. | 148/1.5 |
| 3,400,306 | 9/1968 | Knauss | 317/234 |
| 3,513,035 | 5/1970 | Fitzgerald et al. | 148/1.5 |
| 3,532,910 | 10/1970 | Lee et al. | 317/234 |
| 3,533,857 | 10/1970 | Mayer et al | 148/1.5 |

OTHER PUBLICATIONS

"Isochronal Annealing of P and N-Type Silicon Irradiated at 80°K," Clark et al., Phil. Mag., Nov. 1969, 20, (162), pp. 951 and 958.

*Primary Examiner*—L. Dewayne Rutledge
*Assistant Examiner*—J. M. Davis
*Attorney, Agent, or Firm*—C. L. Menzemer

[57] ABSTRACT

The switching speed of a thyristor is increased without correspondingly increasing the forward voltage drop by selectively irradiating at least portions of the PN junction between the conducting and gating portions, and 5 to 30% of the adjacent surface area of the conducting portions of the device. 50 to 100% of the surface area of the gating portions, and the peripheral portions can also be irradiated at the same time to decrease gate sensitivity and increase blocking voltage of the thyristor, respectively. Preferably, the thyristor is irradiated with electron radiation which preferably is of an intensity greater than 1 Mev and most desirably about 2 Mev. The electron irradiation is preferably to a dosage of between about $1 \times 10^{13}$ electrons/cm$^2$ and $1 \times 10^{15}$ electrons/cm$^2$.

5 Claims, 5 Drawing Figures

SELECTIVE IRRADIATION FOR FAST SWITCHING THYRISTOR WITH LOW FORWARD VOLTAGE DROP

FIELD OF THE INVENTION

The present invention relates to the manufacture of semiconductor devices and particularly fast switching thyristors.

BACKGROUND OF THE INVENTION

Nonlinear, solid state devices that are bistable, that is, they have a high and a low impedance state, are commonly referred to as thyristors. Thyristors are generally switched from one impedance state to the other by means of a control or gating signal. Thyristors are commonly four layer PNPN structures. The basic thyristor structure is usually modified where fast switching and high power-high frequency signals are required. The basic four-layer structure is known for its relatively long turn-on times (i.e. time required to reach peak voltage) and even longer turn-off time (i.e. time required for the base regions to be depleted of stored charge).

For fast switching thyristors, the gate electrode is typically attached to the cathode-base region of the PNPN structure. Since devices of this type are usually fabricated of silicon and are widely used to convert AC to DC or invert DC to AC signals, they are commonly known as "Silicon Controlled Rectifiers" or simply "SCR's." Such devices are also known as "Gate-Controlled Reverse-Blocking Thyristors."

The turn-off time of a thyristor is highly dependent upon the minority carrier lifetimes in the N-impurity anode-base region. The impurity concentrations in the P-impurity cathode-base region is generally much greater than in the N-impurity anode-base region to provide high forward and reverse blocking voltages and low forward voltage drop. As a consequence, the excess charge in the P-impurity base region can be swept out under forward bias, whereas the excess charge in the N-impurity anode-base region must decay by recombination. It follows that the turn-off time of the device is determined primarily by the recombination rate and in turn the minority carrier lifetime in the N-impurity anode-base region.

In the past, the turn-off time of thyristor devices has been reduced by diffusing gold into the semiconductor body to reduce the minority carrier lifetime in the N-impurity base region. However, gold diffusion increases the gate current and in turn decreases the gate sensitivity of the device. Thus, while gold diffusion may permit the device to attain faster switching, the thyristor may have limited marketability because of the need for other specified electrical characteristics.

Alternatively, it has become known to irradiate the thyristor to increase the turn-off time. For example, it has been described in patent application Ser. No. 324,718, filed Jan. 18, 1973, (assigned to the same assignee as the present application) to "bulk" or indiscriminately irradiate fast switching thyristors to decrease the turn-off time. In addition, it has been described in patent application Ser. No. 283,685, filed Aug. 25, 1972 (assigned to the same assignee as the present application) to selectively irradiate the conducting portions of a fast switching thyristor to reduce turn-off time. The difficulty with both of these alternatives is that the forward voltage drop is substantially increased by the irradiation of the conducting portion of the device.

The present invention overcomes this difficulty. It provides a thyristor in which turn-off time is substantially reduced without correspondingly increasing the forward voltage drop.

SUMMARY OF THE INVENTION

The present invention provides a silicon thyristor body in which the turn-off time is decreased without correspondingly increasing the forward voltage drop. The body is disposed with one major surface which adjoins the cathode regions exposed to a suitable radiation source, 60 to 95% of the surface area of the conducting portions is masked against radiation, and thereafter at least portions of PN junction between the conducting and gating portions where they adjoin the major surface and 5 to 30% of the adjacent surface area of the conducting portions of the device are then irradiated by the radiation source. Preferably 50 to 100% of the gating portions as well as the peripheral portions of the device are irradiated at the same time to increase the gate current to fire and the blocking voltage, respectively.

Electron radiation is preferably used as the radiation source because of availability and inexpensiveness. Moreover, electron radiation (or gamma radiation) may be preferred in some applications where the damage desired in the semiconductor lattice is to single atoms and small groups of atoms. This is in contrast to neutron, proton and alpha radiation which causes large disordered regions of as many as a few hundred atoms in the semiconductor crystal. The latter type radiation source may, however, be preferred in certain applications because of its better defined range and better controlled depth of lattice damage. It is anticipated that any kind of radiation may be appropriate provided it is capable of bombarding and disrupting the atomic lattice to create energy levels substantially decreasing carrier lifetimes without correspondingly increasing the carrier generation rates.

Electron radiation is also preferred over gamma radiation because of its availability to provide adequate dosages in a short period of time. For example, a $1 \times 10^{12}$ electrons/cm$^2$ dosage of 2 Mev electron radiation will result in approximately the same lattice damage as that produced by a $1 \times 10^6$ rads dosage of gamma radiation; and a $1 \times 10^{14}$ electrons/cm$^2$ dosage of 2 Mev electron radiation would result in approximately the same lattice damage as that produced by a $1 \times 10^8$ rads dosage of gamma radiation. Such dosages of gamma radiation, however, would entail several weeks of irradiation, while such dosages of electron radiation can be supplied in minutes.

Further, it is preferred that the radiation level of electron radiation be greater than about 1 Mev and lower than 3 Mev. Lower level radiation is generally believed to result in substantial elastic collisions with the atomic lattice and, therefore, does not provide enough damage to the lattice in commercially feasible times. Higher level radiation is believed to cause too severe of damage to the atomic lattice to maintain certain other electrical characteristics of the device.

It has been found that radiation dosages above $1 \times 10^{13}$ electrons/cm$^2$ and more desirably above $3 \times 10^{13}$ electrons/cm$^2$ provide suitable radiation dosages. Lower dosage levels have not been found to affect significant reductions in turn-off times. Conversely, it is preferred that the radiation dosage does not exceed about 1 × $10^{15}$ electrons/$cm^2$ and is preferably below about 2 × $10^{14}$ electrons/$cm^2$ with the precise dosage balanced with the degree of irradiation of the conducting portion so that the forward voltage drop can be maintained low.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the preferred embodiments of the invention and present preferred methods of practicing the invention are illustrated in which.

DESCRIPTION OF THE PREFERRED EMBODIMENTS

Figure 1:
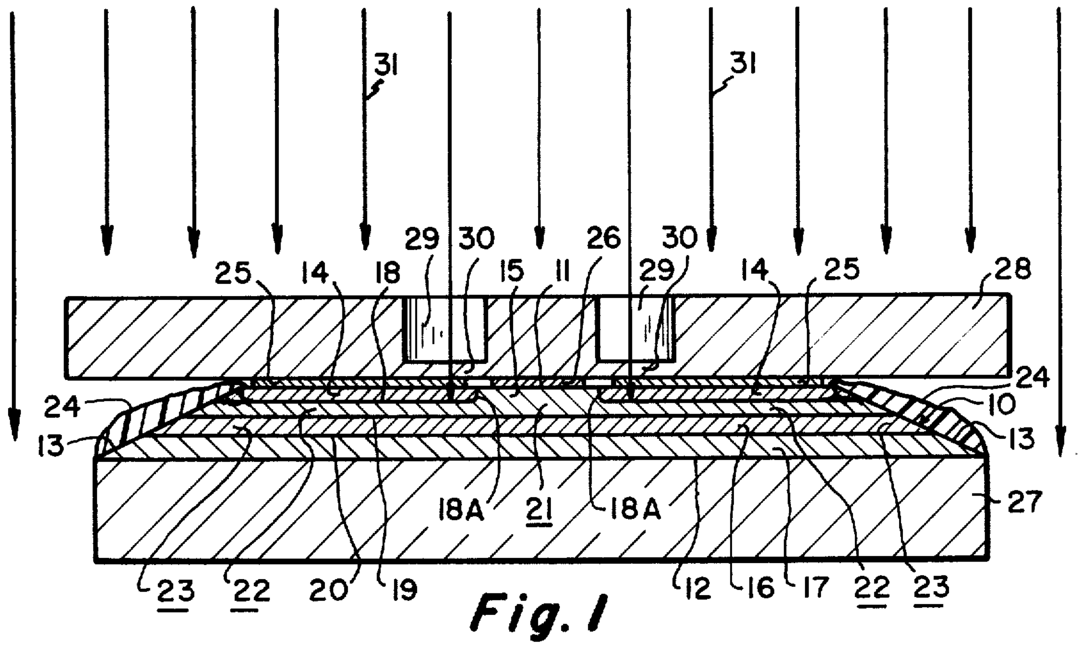
FIG. 1 is an elevational view in cross-section of a center fired thyristor being irradiated in accordance with the present invention.

Referring to FIG. 1, a center fired silicon thyristor wafer or body 10 is shown having opposed major surfaces 11 and 12 and cylindrical side surfaces 13. The thyristor wafer 10 has cathode-emitter region 14 and anode-emitter region 17 of impurities of opposed conductivity type adjoining the major surfaces 11 and 12, respectively. Cathode-base region 15 and anode-base region 16 of opposite conductivity type are provided in the interior of the wafer between emitter regions 14 and 17. The cathode-emitter region 14 and cathode-base region 15 are also of impurities of opposite conductivity type, as are anode-base region 16 and anode-emitter region 17. By this arrangement, thyristor wafer 10 is provided with a four layer impurity structure in which three PN junctions 18, 19 and 20 are provided.

The thyristor is provided with a center fired gate by adjoining cathode-base region 15 to the major surface 11 at central portions thereof. Cathode-emitter region 14 thus extends annularly around portions of cathode-base region 15 to define the entirety of the gating portions 21 in the central part of the device. The entirety of the conducting portions 22 is co-extensive with cathode-emitter region 14. The thyristor body 10 thus is divided with the gating portion 21 at the center of the body and the conducting portions 22 peripheral thereof. The gating and conducting portions 21 and 22 adjoin at major surface 11 to form surface portions 18A of PN junction 18 between the cathode-emitter and the cathode-base regions 14 and 15.

Blocking voltage capability of the device is subsequently increased by shaping the electric field at the peripheral side surfaces 13 of the device. This is done by sandblasting and etching surfaces 13 to form peripheral portion 23 beveled outwardly from the cathode-emitter to anode-emitter, at for example 13°, annular of conducting portions 22. Atmospheric effects on the thyristor operation are substantially reduced by coating side surfaces 13 with a suitable passivating resin 24 such as a silicone, epoxy or varnish composition.

To provide electrical connections to the thyristor, metal contacts 25 and 26 make ohmic contact to cathode-emitter region 14 and cathode-base region 15, respectively, at major surface 11, while metal substrate 27 makes ohmic contact to anode-emitter region 17 at major surface 12. Typically, substrate 26 makes ohmic contact with anode-emitter region 17 by alloying an aluminum foil into surface 12 and then applying metal substrate 27 of, for example, molybdenum to surface 12. Contacts 25 and 26 are then formed by, after etching (i) evaporating aluminum over surface 11 and (ii) then selectively etching away the unwanted portions by use of standard photolithographic techniques.

Selective irradiation is performed in accordance with the present invention on thyristor wafer 10 by masking outer portions of conducting portions 22 and most of gating portions 21 against radiation from a suitable radiation source (not shown). This is done with a circular shield plate 28 of steel, lead or the like with an annular groove 29 cut therein. Shield plate 28 is mechanically positioned in contact with metal contacts 24 and 25 to mask peripheral portions of conducting portion 22 and gating portions 21 of the thyristor against radiation. Plate 27 is of any material of sufficient density and thickness to be opaque to the particular radiation used. For electron radiation, shield plate 28 may be standard low carbon steel about one-fourth inch thickness, or tungsten or lead of about five thirty-seconds inch thickness. After the radiation is completed, shield plate 28 is physically removed for reuse in subsequent irradiations.

The groove 29 is positioned in plate 28 so that exposed to the radiation source are portions of surface 11 adjoining PN junction 18 and the adjacent 5 to 30% of the conducting portions 22 of the device. In this regard, the depth of groove 29 is critical; it must be of sufficient depth so that radiation is not appreciably scattered as it passes through the thin portion 30 of the plate 28. This depth will, of course, vary with the composition of plate 28 and the particular radiation and radiation intensity used. Typically, for steel and 2 Mev electron radiation, the thin portion 30 of plate 28 will be 5 to 10 mils in thickness.

As previously described, the thyristor with shield plate 28 in place is then selectively irradiated with any suitable radiation 31. Preferably it is electron radiation with an intensity greater than 1 Mev and more desirably about 2 Mev for reasons herein previously stated. The surface portion 18A of junction 18 between gating and conducting portions 21 and 22 and the adjacent 5 to 30% of conducting portions 22 are irradiated to decrease the turnoff time while maintaining the forward voltage drop and gate sensitivity of the thyristor. It should be noted that peripheral portions 23 are also masked from radiation 31 so that blocking voltage yield is maintained through the irradiation step.

Figure 2:
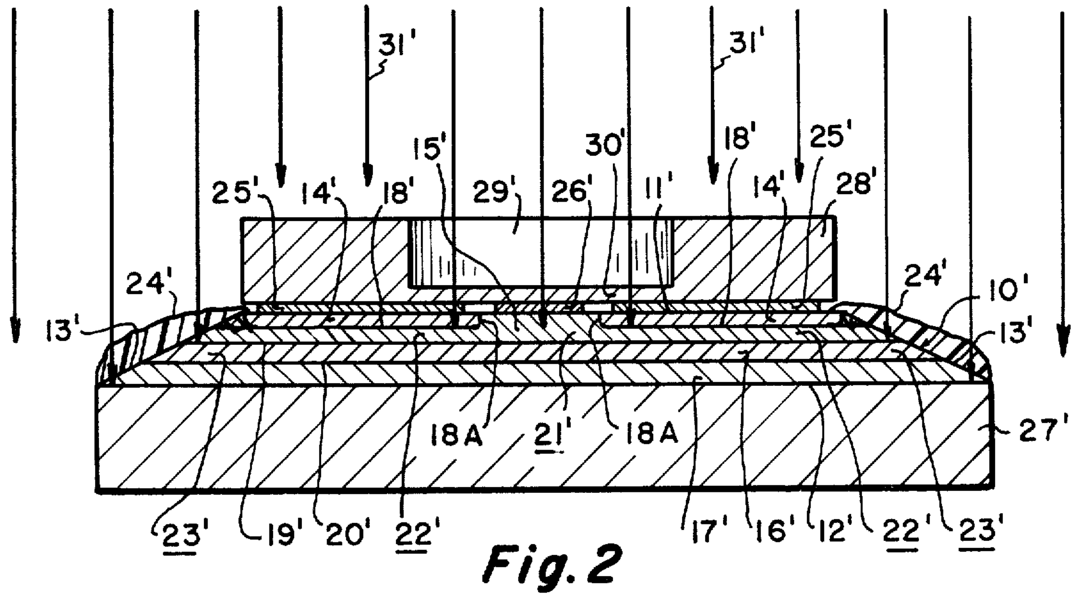
FIG. 2 is an elevational view in cross-section of a center fired thyristor being alternatively irradiated in accordance with the present invention.

Referring to FIG. 2, a center fired thyristor is shown having exactly the same structure as the thyristor of FIG. 1. All of the elements are therefore given prime numbers to indicate their correspondence. The only change is in shield plate 28'. The groove 29' is not an annulus as it is in FIG. 1, but rather a central well. Also, the plate 28' is of smaller diameter corresponding to the outer diameter of cathode-emitter 14'. By these changes, the gating portions 21' and peripheral portions 23' have 100% of their surface areas irradiated at the same time as the junction 18' and the adjacent areas of the conducting portions 22' are irradiated. The device thus, not only has its turn-off time reduced without a corresponding increase in forward voltage drop, but also simultaneously has its gate sensitivity reduced and its blocking voltage yield increased.

Figure 3:
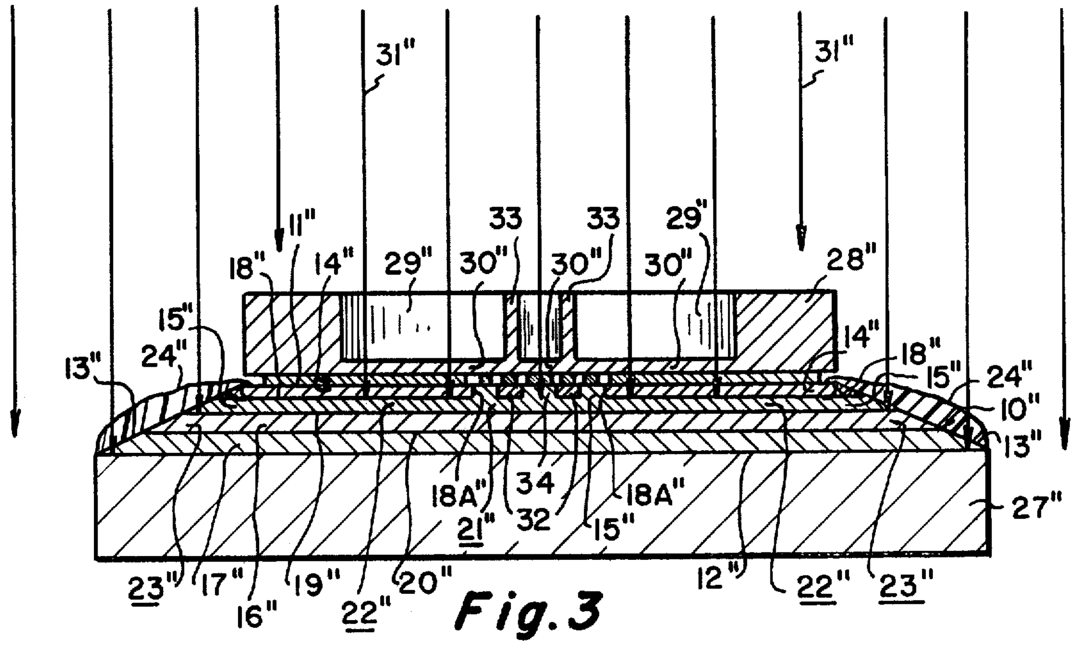
FIG. 3 is an elevational view in cross-section of an alternative center fired thyristor irradiated in accordance with the present invention.

Referring to FIG. 3, an alternative center fired thyristor is shown with ultra-fast turn-on capability. The device has all of the elements of the center fired thyristor shown in FIG. 1, with the below-stated additions. For this reason, corresponding numbers are given to the corresponding components with prime numbers. The additional element is a second annular cathode-emitter region 32 spaced centrally of cathode-emitter region 14'' adjoining major surface 11''. The gating portion 21'' is thus divided into two portions, one central of second cathode-emitter region 32 and one peripheral of second cathode-emitter region 32.

The shield plate 28'' also is altered to provide for irradiation of junction 18A'' between the conducting portions 22'' and gating portion 21'' and the adjacent 5 to 30% of conducting portion 22'', as well as the gating portions as previously described. An annulus 33 is provided in groove 29'' corresponding to cathode-emitter region 32. The device thus masked and subsequently irradiated with radiation 31'' has not only a particularly fast turn-on time and reduced gate sensitivity, but also fast turn-off time and reduced gate sensitivity without a corresponding increase in forward voltage drop. It should also be noted that, as in the device of FIG. 2, the shield plate 28'' does not extend to mask peripheral portion 23'' of the devices. The resulting simultaneous irradiation of peripheral portion provides a device with increased blocking voltage yield.

Figure 4:
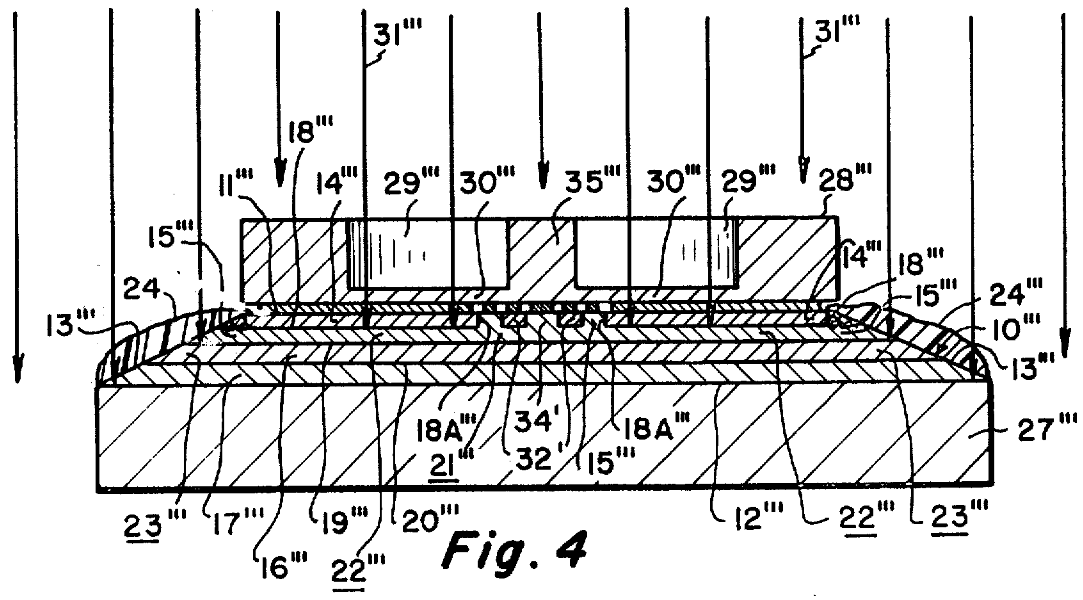
FIG. 4 is an elevational view in cross-section of an alternative center fired thyristor alternatively irradiated in accordance with the present invention.

Referring to FIG. 4, a center fired thyristor is shown having identical structure to that shown in FIG. 3. Again prime numbers are used to indicate the corresponding elements. The change is in the shield plate 28'''. Annulus 33 as shown in FIG. 3 is made as a central cylindrical part 35 of the plate 28''' so that the central portion 34 of gating portion 21''' is not irradiated. The result is a device with a lower gate current to fire than the thyristor irradiated in accordance with FIG. 3, while providing a reduced turn-off time without a corresponding increase in forward voltage drop.

Figure 5:
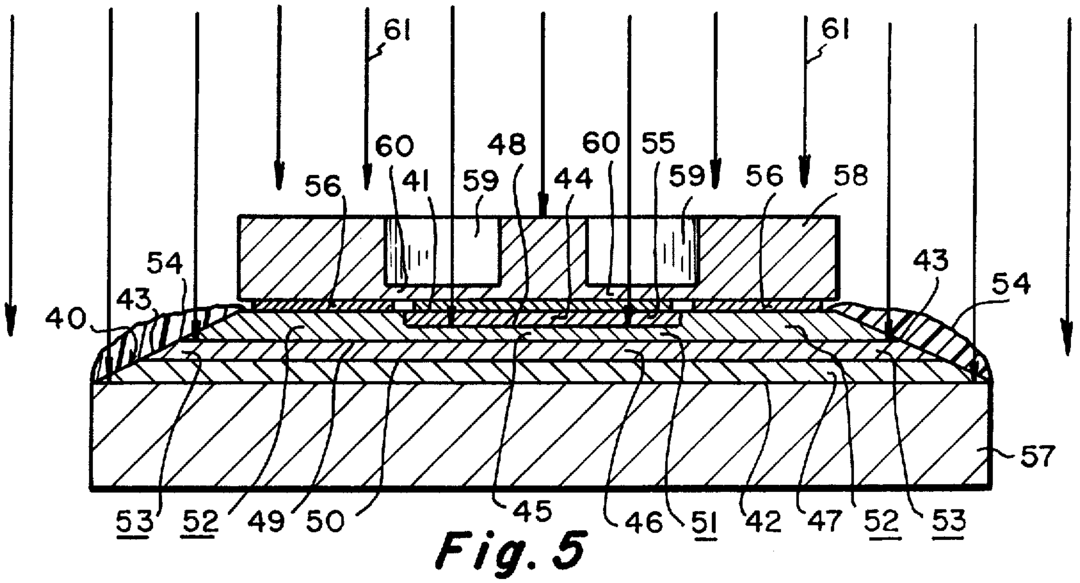
FIG. 5 is an elevational view in cross-section of an edge fired thyristor irradiated in accordance with the present invention.

Referring to FIG. 5, an edge fired silicon thyristor wafer or body 40 is shown having opposed major surfaces 41 and 42 and cylindrical side surfaces 43. The thyristor wafer 40 has cathode-emitter region 44 and anode-emitter region 47 of impurities of opposed conductivity type adjoining the major surfaces 41 and 42, respectively. Cathode-base region 45 and anode-base region 46 of impurities of opposite conductivity type are provided in the interior of the wafer between emitter regions 44 and 47. The cathode-emitter region 44 and cathode-base region 45 are also of impurities of opposite conductivity type, as are anode-base region 46 and anode-emitter region 47. By this arrangement, thyristor wafer 40 is provided with a four layer impurity structure in which three PN junctions 48, 49 and 50 are provided.

The thyristor is provided with a periphery fired gate by adjoining cathode-base region 45 to the major surface 41 at outward portions thereof. Cathode-base region 45 thus extends annularly around cathode-emitter region 44 to define the entirety of conducting portions 51 at the central part of the device. The entirety of the gating portions 52 of the device is co-extensive with the portions of the cathode-base region 45 adjoining major surface 41 at the peripheral part of the device. The thyristor body 40 is thus divided with conducting and gating portions 51 and 52 adjoining each other at surface 41 with portion 48A or PN junction 48 formed at the transition.

Blocking voltage capability of the device is again subsequently increased by shaping the electric field at the side surfaces 43 of the device. This is done by sandblasting and etching surfaces 43 to form peripheral portion 53 beveled outwardly from the cathode-emitter to the anode-emitter, at for example 13°, annularly of the gating portion 52. Atmospheric effects on the thyristor operation are substantially reduced by coating side surfaces 43 with a suitable passivating resin 54 such as a silicone, epoxy or varnish composition.

To provide electrical connections to the thyristor, metal contacts 55 and 56 make ohmic contact to cathode-base region 45 and cathode-emitter region 44, respectively, at major surface 41, while metal substrate 57 makes ohmic contact to anode-emitter region 47 at major surface 42. Typically, substrate 57 makes ohmic contact with anode-emitter region 47 by alloying an aluminum foil into surface 42 and then applying metal substrate 57 to the surface 42. Contacts 44 and 45 are then formed by, after etching, evaporating aluminum over surface 41 and then selectively etching away unwanted portions by use of standard photolithographic techniques.

Selective irradiation is performed in accordance with the present invention on thyristor wafer 40 by masking inner portions of conducting portions 51 and most of gating portions 52 against radiation from a suitable radiation source (not shown). This is done with a circular shield plate 58 of steel, lead or the like with an annular groove 59 cut therein. Shield plate 58 is mechanically positioned in contact with metal contacts 55 and 56 to mask inner portions of conducting portion 51 and gating portions 52 of the thyristor against radiation. Plate 58 is of any material of sufficient density and thickness to be opaque to the particular radiation used. For electron radiation, shield plate 58 may be standard low carbon steel about one-fourth inch thickness, or tungsten or lead of about five thirty-seconds inch thickness. After the radiation is completed, shield plate 58 is physically removed for reuse in subsequent irradiations.

The groove 59 is positioned in plate 58 so that exposed to the radiation source are portions of surface 51 adjoining PN junction 48 and the adjacent 5 to 30% of the conducting portions 51. In this regard, the depth of groove 59 is again critical; it must be of sufficient depth so that radiation is not appreciably scattered as it passes through the thin portion 60 of the plate 58. This depth will, of course, vary with the composition of plate 58 and the particular radiation and radiation intensity used. Typically, for steel and 2 Mev electron radiation, the thin portion 60 of plate 58 will be 5 to 10 mils in thickness.

As previously described, the thyristor with shield plate 58 in place is then selectively irradiated with any suitable radiation 61. Preferably it is electron radiation with an intensity greater than 1 Mev and more desirably about 2 Mev for reasons herein previously stated. The surface portion 48A of junction 48 between conducting and gating portions 51 and 52 and the adjacent 5 to 30% surface area of conducting portion 51 are irradiated to decrease the turn-off time while maintaining substantially unchanged, the forward voltage drop and gate sensitivity of the thyristor. It should be noted that peripheral portions 53 are also irradiated from radiation 61 at the same time so that blocking voltage is also increased through the irradiation step.

The merits of the invention were illustrated by selective irradiation of a group of center fired thyristors rated 600 volts blocking and 1.2 volts forward at 625 amps. The rated gate current to fire these devices is 40 milliamps. The thyristor wafers were 1.312 inches in diameter, with a cathode-emitter region with an outer diameter of 1.016 inches by virtue of beveled side surfaces. The center gate of such thyristor also measured 0.125 inch in diameter.

Six thyristor wafers were selectively irradiated utilizing an annular steel shield plate having 1½ inches outside diameter and five-eighths inch inside diameter. The irradiated portion of the device was thereby calculated to be 100% of the surface area of the gating portion, the junction between the conducting and gating portions, and 16 to 20% of the surface area of the conducting portion. For control, six other similar thyristor wafers were indiscriminately irradiated at the same time. All the thyristors were irradiated with 2 Mev radiation to a dosage of $4.96 \times 10^{13}$ electrons/cm$^2$.

The electrical characteristics of the device were then measured. The results are shown in Table I where the first six runs were selectively irradiated and the last six runs were indiscriminately irradiated.

TABLE I

| Device No. | $V_{RM}$ (volts) | $V_{BO}$ (volts) | $V_G$ (volts | $I_G$ (ma) | $t_{off}$ (μs) | $V_{f\text{-}at\ 625}$ A (volts) |
|---|---|---|---|---|---|---|
| 1 | 900 | 900 | 1.8 | 140 | 13 | 1.25 |
| 2 | 1200 | 1400 | 1.6 | 50 | 24 | 1.30 |
| 3 | 1150 | 1150 | 1.7 | 60 | 24 | 1.35 |
| 4 | 1200 | 1300 | 1.7 | 50 | 28 | 1.3 |
| 5 | 1400 | 1400 | 1.5 | 40 | 21 | 1.32 |
| 6 | 1000 | 1000 | 1.5 | 100 | 17 | 1.23 |
| 7 | 870 | 870 | 1.5 | 90 | 21 | 1.44 |
| 8 | 910 | 910 | 1.6 | 110 | 21 | 1.51 |
| 9 | 1200 | 1100 | 1.7 | 60 | 28 | 1.57 |
| 10 | 850 | 850 | 1.25 | 90 | 16 | 1.59 |
| 11 | 1200 | 1200 | 1.55 | 110 | 18 | 1.62 |
| 12 | 950 | 950 | 1.75 | 110 | 21 | 1.46 |

The data shows that selective irradiation in accordance with the present invention results in a substantial reduction in turn-off time without a significant increase in forward voltage drop. The thyristors before irradiation had no speed, i.e. $t_{off}$ greater than 80 μsec. In addition, the data shows that although similar turn-off times can be achieved with indiscriminate irradiation, the forward voltage drop is significantly higher than with the selective irradiation of the present invention.

To further illustrate the invention, seven center fired thyristors were selectively irradiated utilizing an annular steel shield plate having an 0.914 inch outside diameter and an 0.437 inch inside diameter. The thyristors were rated 800 volts blocking and 1.45 volts forward at 625 amps. The thyristor wafers were about 1.3 inches in diameter with a cathode emitter region with an outside diameter of 0.914 inch. The irradiated portions of the device were thereby calculated to be 100% of the surface area of the gating portion, the junction between the conducting and gating portions, and 16 to 20% of the surface area of the conducting portion. For control, six similar thyristor wafers were indiscriminately irradiated at the same time. All thyristors were irradiated with 2 Mev radiation to a dosage of $1 \times 10^{14}$ electrons/cm$^2$.

The electrical characteristics of the devices were then measured and the results tabulated in Table II. The first seven runs were selectively irradiated in accordance with the invention and the last six runs were indiscriminately irradiated.

TABLE II

| Device No. | $t_{off}$ (μs) | $V_{f\text{-}at\ 625\ A}$ (volts) |
|---|---|---|
| 1 | 19 | 1.55 |
| 2 | 21 | 1.55 |
| 3 | 23 | 1.51 |
| 4 | 21 | 1.57 |
| 5 | 30 | 1.53 |
| 6 | 20 | 1.62 |
| 7 | 24 | 1.57 |
| 8 | 6 | >3.0 |
| 9 | 10 | >3.0 |
| 10 | 7 | >3.0 |
| 11 | 11 | >3.0 |
| 12 | 11 | >3.0 |
| 13 | 10 | >3.0 |

The data shows that selective irradiation as described results in a substantial reduction in turn-off time without significantly increasing forward voltage drop. The turn-off time of the devices before irradiation was greater than 80 microseconds. Conversely, indiscriminate irradiation as shown by the data reduces the turn-off time but also increases the forward voltage drop to a commercially impractical value.

To further illustrate the invention, a further group of center fired thyristors rated 600 volts blocking and 1.3 volts forward at 625 amps, which were similar to the thyristor shown in FIG. 3, were selectively irradiated in accordance with the invention. The thyristor wafers were nominally 0.914 inch in diameter with a cathode-emitter region 14'' of about 0.720 inch outside diameter and about 0.250 inch inside diameter. The smaller inside cathode-emitter region 32 had a nominal outside diameter of 0.230 inch and nominal inside diameter of 0.100 inch. The center gate 34 also measured about 0.100 inch in diameter.

The thyristors were irradiated using a shield 28 as shown in FIG. 3 having a diameter of about 0.914 inch. Grooves 29'' have an outside diameter of about 0.500 inch, and annulus 33 has an outside diameter of about 0.180 inch and an inside diameter of about 0.090 inch. The irradiated portion of the device was thereby calculated to be about 75–85% of gating portions 21'', and 15–16% of the conducting portion 22'' adjoining junction 18A, along with junction 18A itself. The irradiation was performed with 2 Mev electron radiation to a dosage of $8 \times 10^{13}$ electrons/cm$^2$.

The electrical characteristics of the devices were then measured after radiation and the measurements tabulated in Table III.

TABLE III

| Device No. | $V_F$ (volts) | $I_G$ (ma) | $t_{off}$ (μsec) |
|---|---|---|---|
| 1 | 1.35 | 65 | 14 |
| 2 | 1.38 | 60 | 12 |
| 3 | 1.34 | 60 | 12 |
| 4 | 1.48 | 75 | 16 |
| 5 | 1.46 | 60 | 14 |
| 6 | 1.46 | 110 | 12 |
| 7 | 1.42 | 95 | 11 |
| 8 | 1.48 | 75 | 12 |
| 9 | 1.40 | 65 | 13 |
| 10 | 1.52 | 80 | 11 |

As can be seen from the data, the turn-off time is substantially reduced and the gate current to fire was increased, while the forward voltage drop remained substantially unchanged. The turn-off time of the devices before irradiation was greater than 80 microseconds.

While presently preferreed embodiments have been shown and described with particularity, it is distinctly understood that the invention may be otherwise variously performed within the scope of the following claims.

What is claimed is:

1. A method of decreasing the turn-off time of a thyristor without correspondingly increasing the forward voltage drop of the device comprising the steps of:
   a. masking against radiation between about 60 and 95% of the surface area of conducting portions of the thyristor spaced from gating portions of the thyristor; and
   b. thereafter irradiating surface portions of a PN junction formed between cathode-emitter and cathode-base regions of the thyristor and about 5 to 30% of the adjacent surface area of conducting portions of the thyristor.

2. A method of decreasing the turn-off time of a thyristor without correspondingly increasing the forward voltage drop of the device as set forth in claim 1 wherein:
   the irradiating step is performed with electron radiation of greater than 1 Mev intensity.

3. A method of decreasing the turn-off time of a thyristor without correspondingly increasing the forward voltage drop of the device as set forth in claim 2 wherein:
   the irradiating step is performed to a radiation dosage of between about $1 \times 10^{13}$ and $1 \times 10^{15}$ electrons/cm$^2$.

4. A method of decreasing the turn-off time of a thyristor without correspondingly increasing the forward voltage drop of the device as set forth in claim 1 wherein in addition:
   about 50 to 100% of gating portions of the thyristor are irradiated as a part of step (b) to increase the gate current to fire the thyristor.

5. A method of decreasing the turn-off time of a thyristor without correspondingly increasing the forward voltage drop of the device as set forth in claim 1 wherein:
   peripheral portions of the thyristor are irradiated as part of step (b) to increase the blocking voltage yield of the thyristor.

* * * * *